US011630164B2

(12) United States Patent
Ikarashi et al.

(10) Patent No.: US 11,630,164 B2
(45) Date of Patent: Apr. 18, 2023

(54) HIGH-VOLTAGE SYSTEM AND FAILURE DIAGNOSIS METHOD FOR HIGH-VOLTAGE SYSTEM

(71) Applicant: Hitachi Automotive Systems, Ltd., Hitachinaka (JP)

(72) Inventors: Daisuke Ikarashi, Tokyo (JP); Kenji Kubo, Hitachinaka (JP); Michihiro Asanuma, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 445 days.

(21) Appl. No.: 16/756,014

(22) PCT Filed: Oct. 3, 2018

(86) PCT No.: PCT/JP2018/037035
§ 371 (c)(1),
(2) Date: Apr. 14, 2020

(87) PCT Pub. No.: WO2019/093026
PCT Pub. Date: May 16, 2019

(65) Prior Publication Data
US 2020/0300926 A1 Sep. 24, 2020

(30) Foreign Application Priority Data
Nov. 8, 2017 (JP) .............................. JP2017-215473

(51) Int. Cl.
*B60G 13/08* (2006.01)
*G01R 31/62* (2020.01)
(Continued)

(52) U.S. Cl.
CPC ............. *G01R 31/62* (2020.01); *B60G 13/08* (2013.01); *F16F 9/185* (2013.01); *F16F 9/532* (2013.01);
(Continued)

(58) Field of Classification Search
CPC .... F16F 9/53; F16F 9/185; F16F 9/532; F16F 2222/12; F16F 2224/043; F16F 2228/066;
(Continued)

(56) References Cited

U.S. PATENT DOCUMENTS 5,070,284 A * 12/1991 Patil ..................... F16F 15/03
188/266.8
5,952,832 A * 9/1999 Stevanovic ............ G01R 31/44
324/403

(Continued)

FOREIGN PATENT DOCUMENTS

EP 0837586 A2 * 10/1997 .............. H04M 1/31
JP 2009-95164 A 4/2009
(Continued)

OTHER PUBLICATIONS

International Search Report (PCT/ISA/210) issued in PCT Application No. PCT/JP2018/037035 dated Nov. 20, 2018 with English translation (four (4) pages).
(Continued)

*Primary Examiner* — Christopher P Schwartz
(74) *Attorney, Agent, or Firm* — Crowell & Moring LLP (57) ABSTRACT

Provided are a reliable high-voltage system and a failure diagnosis method thereof, in which a vibration damping mechanism using an electrorheological fluid as a working fluid is a load, and can prevent electric shock due to leakage current and the influence on surrounding electronic devices. There are provided a first circuit that includes a power source and a ground, a second circuit that is magnetically coupled to the first circuit via a transformer and includes a load connected to the ground, a controller that is connected to the ground, a third circuit that is connected to the second circuit and the ground, a first resistor that is provided between a connection point at a high potential end of the second circuit and the ground, and a second resistor that is
(Continued)

provided between a connection point at a low potential end of the second circuit and the ground, and has a resistance value different from a resistance value of the first resistor.

13 Claims, 5 Drawing Sheets (51) Int. Cl.
*F16F 9/18* (2006.01)
*F16F 9/53* (2006.01)
*H01F 1/44* (2006.01)
*H02M 3/335* (2006.01)

(52) U.S. Cl.
CPC ............ *H01F 1/447* (2013.01); *H02M 3/335* (2013.01); *B60G 2202/24* (2013.01); *B60G 2204/62* (2013.01); *B60G 2206/41* (2013.01); *B60G 2500/104* (2013.01); *B60G 2600/08* (2013.01); *B60G 2800/162* (2013.01); *F16F 2222/12* (2013.01); *F16F 2224/043* (2013.01); *F16F 2228/066* (2013.01); *F16F 2230/18* (2013.01)

(58) Field of Classification Search
CPC ........ F16F 2230/18; G01R 31/62; H01F 1/44; H01F 1/447; B60G 13/08; B60G 2202/24; B60G 2204/62; B60G 2206/41; B60G 2500/104; B60G 2600/08; B60G 2800/162; H02M 3/335

USPC ............................................ 188/266.8, 267.1
See application file for complete search history.

(56) References Cited

U.S. PATENT DOCUMENTS

| | | | |
|---|---|---|---|
| 10,897,192 B1* | 1/2021 | Jain ......................... | H02M 1/36 |
| 2009/0020382 A1* | 1/2009 | Van Weelden .......... | F16F 9/465 |
| | | | 188/282.3 |
| 2009/0102395 A1* | 4/2009 | Iwasaki ............. | H02M 3/33507 |
| | | | 363/21.01 |
| 2011/0100775 A1* | 5/2011 | Foister .................... | F16F 9/535 |
| | | | 188/267.2 |
| 2018/0051767 A1 | 2/2018 | Tanabe et al. | |
| 2020/0139780 A1* | 5/2020 | Krämer ................... | F16F 9/185 |

FOREIGN PATENT DOCUMENTS

| | | | | |
|---|---|---|---|---|
| JP | 5497614 B2 | 5/2014 | | |
| WO | WO 2017/057213 A1 | 4/2017 | | |
| WO | WO-2019049431 A1 * | 3/2019 | ............. | F16F 13/30 |
| WO | WO-2022211661 A1 * | 10/2022 | ............. | B60G 13/08 |

OTHER PUBLICATIONS

Japanese-language Written Opinion (PCT/ISA/237) issued in PCT Application No. PCT/JP2018/037035 dated Nov. 20, 2018 (four (4) pages).

* cited by examiner

FIG. 6

HIGH-VOLTAGE SYSTEM AND FAILURE DIAGNOSIS METHOD FOR HIGH-VOLTAGE SYSTEM

TECHNICAL FIELD

The present invention relates to a high-voltage system for boosting a power source voltage using a transformer, and particularly to a high-voltage system loaded with a vibration damping mechanism using an electrorheological fluid as a working fluid for obtaining a damping force.

BACKGROUND ART

Generally, vehicles such as automobiles are equipped with a damper for damping mechanical vibrations and shocks applied from the outside via tires. As a working fluid used for the damper, for example, as disclosed in PTL 1, it has been proposed to use an electrorheological fluid.

The electrorheological fluid is a fluid whose viscosity can be controlled by applying an electric field having a high electric field intensity of about several kV/mm from outside. The electrorheological fluid has an advantage of high responsiveness because the viscosity of the fluid can be directly controlled by an electric signal without having a movable part. As application examples of the electrorheological fluid, for example, a vibration damping mechanism such as an electrorheological fluid damper and an electrorheological fluid engine mount used for shock absorption, vibration control, and the like are known.

A high-voltage system loaded with a vibration damping mechanism using an electrorheological fluid is basically a voltage control device consisting of a booster circuit and the like, and a vibration damping mechanism which is sealed with the electrorheological fluid and has a pair of electrodes that apply an electric field to the electrorheological fluid. Then, the viscosity of the electrorheological fluid is controlled by controlling a boosted voltage boosted by a booster circuit by the voltage control device.

CITATION LIST

Patent Literature

PTL 1: WO 2017/057213

SUMMARY OF INVENTION

Technical Problem

The outer cylinder of the vibration damping mechanism is connected to the vehicle via an insulator such as a rubber bush or rubber mount. However, if the insulator such as the rubber bush or the rubber mount is exposed to muddy water, salt water, or the like, the insulation resistance between the cylinder and the chassis ground of the vehicle decreases, and the leakage current returning to the control device via a chassis ground of the vehicle without passing through the wiring between the voltage control device and the vibration damping mechanism increases in the current supplied from the voltage control device to the vibration damping mechanism, noise increases, and adversely affects surrounding electronic devices.

Therefore, an object of the invention is to provide a reliable high-voltage system and a failure diagnosis method thereof, in which a vibration damping mechanism using an electrorheological fluid as a working fluid is a load, and can prevent electric shock due to leakage current and the influence on surrounding electronic devices.

Solution to Problem

In order to solve the above problems, the invention provides a first circuit that includes a power source and a ground, a second circuit that is magnetically coupled to the first circuit via a transformer and includes a load connected to the ground, a controller that is connected to the ground, a third circuit that is connected to the second circuit and the ground, a first resistor that is provided between a connection point at a high potential end of the second circuit and the ground, and a second resistor that is provided between a connection point at a low potential end of the second circuit and the ground, and has a resistance value different from that of the first resistor.

The invention also provides a failure diagnosis method for a high-voltage system which includes a first circuit that includes a power source and a ground, a second circuit that is magnetically coupled to the first circuit via a transformer and includes a load connected to the ground, a controller that is connected to the ground, a third circuit that is connected to the second circuit and the ground, a first resistor that is provided between a connection point at a high potential end of the second circuit and the ground, and a second resistor that is provided between a connection point at a low potential end of the second circuit and the ground, and has a resistance value different from that of the first resistor. When a voltage across the second resistor is equal to or higher than a predetermined threshold voltage, it is determined that the high-voltage system has failed.

Advantageous Effects of Invention

According to the invention, an outer cylinder of a vibration damping mechanism is directly grounded to a chassis ground of a vehicle using a grounding cable in advance, so that the decrease in insulation resistance of an insulator between the outer cylinder of the vibration damping mechanism and the chassis ground of the vehicle can be excluded, and the electric shock from the outer cylinder of the vibration damping mechanism can be protected.

Further, a second resistor are provided between the ground of the first circuit and the ground of the second circuit of the voltage control device, and the impedance of the path returning to the voltage control device via the chassis ground of the vehicle from the vibration damping mechanism is made sufficiently larger than the impedance of the path returning to the voltage control device via a wiring between the voltage control device and the vibration damping mechanism from the vibration damping mechanism. Therefore, the leakage current returning to the voltage control device via the power source device can be reduced, and adverse effects on surrounding electronic devices due to an increase in noise can be prevented.

Objects, configurations, and effects besides the above description will be apparent through the explanation on the following embodiments.

DESCRIPTION OF EMBODIMENTS

Hereinafter, embodiments of the invention will be described in detail using the drawings. In the drawings, the same configurations are denoted by the same reference numerals, and detailed description of overlapping portions will be omitted. The invention is not limited to the following embodiments, and various modifications and applications may be included in the scope of the technical ideas of the invention.

First Embodiment

A high-voltage system according to a first embodiment will be described with reference to FIGS. 1 and 2.

First, a brief description will be given using FIG. 1 about a structure of a vibration damping mechanism 12 using an electrorheological fluid 16 as a working fluid corresponding to a load of a voltage control device 10 of this embodiment. The configuration of a high-voltage system of this embodiment will be described using FIG. 2. The vibration damping mechanism 12 in FIG. 2 schematically illustrates the cross-sectional structure illustrated in FIG. 1. The detailed structure of the vibration damping mechanism 12 using the electrorheological fluid 16 as a working fluid is also described in PTL 1 above.

Figure 1:
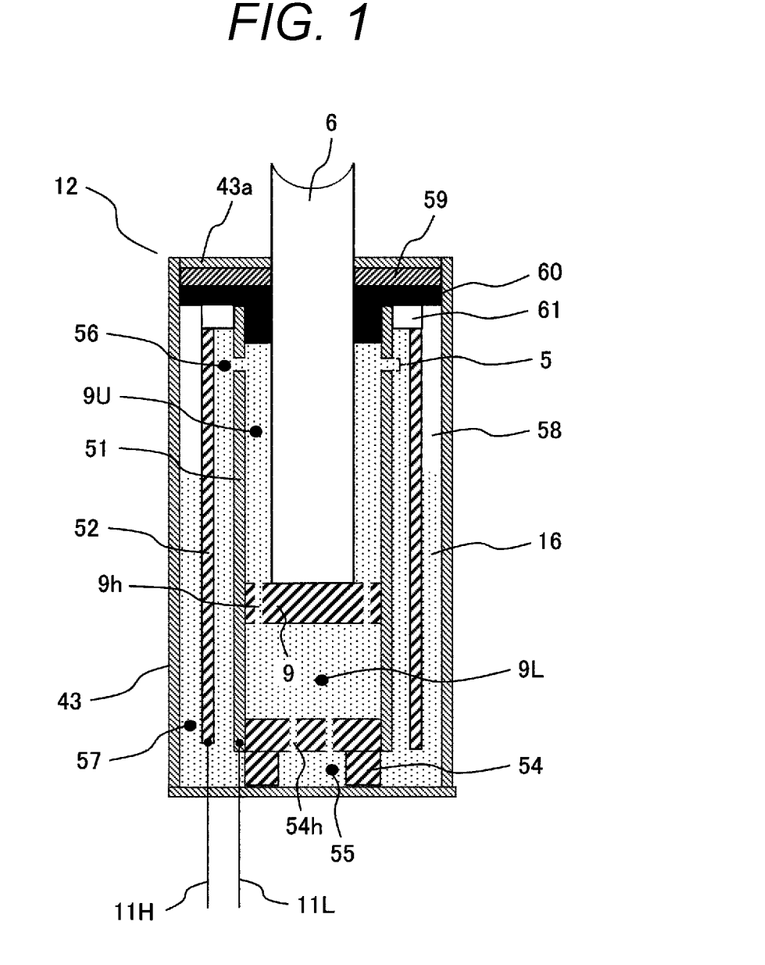
FIG. 1 is a schematic longitudinal sectional view illustrating a schematic structure of a vibration damping mechanism according to an embodiment of the invention.

FIG. 1 is a schematic longitudinal sectional view for explaining the structure of the vibration damping mechanism 12 using the electrorheological fluid 16 as a working fluid. The vibration damping mechanism 12 fixes the head of a piston rod to a vehicle body via a rubber mount insulator 44 (not illustrated in FIG. 1), and the end portion of an outer cylinder 43 into which the piston rod 6 is inserted on the axle side is fixed through a rubber bush (insulator 44) so that impact and vibration between the vehicle body and the vehicle axis is reduced.

As illustrated in FIG. 1, the vibration damping mechanism 12 is provided with a head (not illustrated) on an end side (upper end in the drawing) in the axial direction, a piston 9 on the other end side (lower end in the drawing), and includes the piston rod 6, an inner cylinder 51 into which the piston rod 6 is inserted to function as an electrode, and an outer cylinder 43 provided outside the inner cylinder 51.

Further, between the inner cylinder 51 and the outer cylinder 43, the intermediate cylinder 52 is provided, and a flow path 56 is formed in a space between the intermediate cylinder 52 and the inner cylinder 51 so that the electrorheological fluid 16 flows from an end side (upper end in the drawing) of the vibration damping mechanism 12 in the axial direction toward the other end side (lower end in the drawing) by reciprocation (upward and downward movement) of the piston rod 6. The intermediate cylinder 52 functions as an electrode. The piston rod 6, the inner cylinder 51, the intermediate cylinder 52, and the outer cylinder 43 are arranged concentrically.

The inside of the outer cylinder 43 is filled with the electrorheological fluid 16, and the upper portion between the inside of the outer cylinder 43 and the outside of the intermediate cylinder 52 is filled with an inert gas 58. The inner cylinder 51 and the intermediate cylinder 52 are connected to the voltage control device 10 (not illustrated in FIG. 1) via a connection cable 11L and a connection cable 11H, respectively. The damping force of the vibration damping mechanism 12 is controlled by controlling the intensity of the electric field applied between the inner cylinder 51 and the intermediate cylinder 52 by the voltage control device 10.

An upper end plate 43a of the outer cylinder 43 is provided with an oil seal 59 for preventing the electrorheological fluid 16 sealed in the inner cylinder 51 from leaking, and the lower end of the oil seal 59 is provided to close the end portions on one end side (upper end in the drawing) of the inner cylinder 51 and the outer cylinder 43 in the axial direction. A rod guide 60 is provided to support the piston rod 6.

A base valve 54 is provided at a lower end portion of the inner cylinder 51, and a through hole 54h is provided in the base valve 54 in the same manner as a through hole 9h provided in the piston 9. A piston lower chamber 9L and a flow path 55 described below communicate through the through hole 54h. The base valve 54 is provided with four legs (not illustrated), and is fixed to the bottom of the outer cylinder 43 via the four legs.

In the vicinity of the upper end of the inner cylinder 51, a plurality of lateral holes 5 penetrating in the radial direction are arranged at equal intervals in the circumferential direction. The lateral hole 5 communicates a piston upper chamber 9U defined by the inside of the inner cylinder 51 and the rod-shaped portion of the piston rod 6, and a flow path 56 defined by the inside of the intermediate cylinder 52 and the outside of the inner cylinder 51. At the lower end portion, the flow path 56 communicates a flow path defined by the inside of the outer cylinder 43 and the outside of the intermediate cylinder 52, and a flow path 55 between the base valve 54 and the bottom of an outer cylinder 42 through a gap between four legs (not illustrated) of the base valve 54.

In the above-described vibration damping mechanism 12, the inner cylinder 51, which is an energizing portion connected to the voltage control device 10, is electrically connected to the outer cylinder 43 via the base valve 54 and the rod guide 60 in terms of structure. Since the outer cylinder 43 is exposed outside the vehicle, it is desirable that the inner cylinder 51 and the outer cylinder 43 be insulated from the viewpoint of electric shock protection.

However, a residual axial force is necessarily applied between the rod guide 60, the inner cylinder 51, the base valve 54, and the outer cylinder 43 in order to press and fix the base valve 54 to the bottom of the outer cylinder 43 by the rod guide 60 and the inner cylinder 51. In order to insulate the inner cylinder 51 and the outer cylinder 43, it is necessary to provide an insulating member between the rod guide 60 and the outer cylinder 43 and between the base valve 54 and the outer cylinder 43. However, since there is a need to apply the above-described residual axial force, high strength is required for the insulating member, and it is difficult to provide an insulating member between the rod guide 60 and the outer cylinder 43 and between the base valve 54 and the outer cylinder 43.

Next, the high-voltage system of this embodiment when the vibration damping mechanism 12 illustrated in FIG. 1 is used as a load will be described with reference to FIG. 2. FIG. 2 illustrates an example in which the vibration damping mechanism 12 is attached to the front wheel and the rear wheel of a two-wheeled vehicle.

When the damping forces of the plurality of vibration damping mechanisms 12 are independently controlled, one voltage control device 10 is required for one vibration damping mechanism. However, when a plurality of the voltage control devices 10 are required, the housing and the circuit components of the voltage control device 10 can be shared by integrating the plurality of the voltage control devices 10 into an integrated voltage control device. Therefore, the configuration of the voltage control device can be simplified. FIG. 2 illustrates an example in which two voltage control devices 10 are housed in a common integrated housing 4 to form an integrated voltage control device.

The two voltage control devices 10 are connected to a power source (in-vehicle battery) 35, and receive a first damping force command value Fref1 and a second damping force command value Fref2 from a higher-level control device (not illustrated). The first damping force command value Fref1 and the second damping force command value Fref2 may be the same command value or different command values. Since the two voltage control devices 10 have the same configuration, in the following description, the configuration of the voltage control device 10 to which the first damping force command value Fref1 is input will be described.

The voltage control device 10 includes at least a booster circuit 21 and a controller 23. The booster circuit 21 includes a first circuit 14, a boosting transformer (transformer) 25, and a second circuit 15. The first circuit 14 includes an input-side smoothing capacitor 24, a semiconductor switching element 26, and a semiconductor switching element drive circuit 27. The second circuit 15 includes a rectifier diode 28, an output-side smoothing capacitor 29, a load current detection unit (third circuit) 30, and a load voltage detection unit 31. The first circuit 14 and the second circuit 15 are electrically (magnetically) coupled via the boosting transformer (transformer) 25.

The controller 23 includes a load voltage command calculation unit 22, a load current command calculation unit 32, and a PWM pulse generation unit 33. The load current command calculation unit 32 calculates a load current command value Iloadref so that the difference Verr between a load voltage command value Vref and a load voltage value Vload disappears based on the damping force command value Fref1 by a feedback element such as a P controller or a PI controller, and outputs the calculated value to the PWM pulse generation unit 33. The PWM pulse generation unit 33 generates an ON/OFF signal Vpls for the semiconductor switching element 26 based on the load current command value Iloadref, and outputs the signal to the semiconductor switching element drive circuit 27.

The first damping force command value Fref1 output from a higher-level control device (not illustrated) is input to the load voltage command calculation unit 22 in the controller 23, and the load voltage command calculation unit 22 calculates the load voltage command value Vref. Since the viscosity characteristics of the electrorheological fluid with respect to the intensity of the electric field applied to the electrorheological fluid 16 have a temperature dependency, the load voltage command calculation unit 22 corrects the load voltage command value Vref according to the temperature of the electrorheological fluid 16.

The temperature of the electrorheological fluid 16 is calculated from the resistance value of a resistance component of the electrorheological fluid and its temperature dependency. The resistance value of the resistance component 17 of the electrorheological fluid is calculated by dividing the load voltage Vload_det detected from the load voltage detection unit 31 of the voltage control device 10 by the load current Iload_det detected from the load current detection unit (third circuit) 30.

The difference Verr between the load voltage command value Vref and the load voltage value Vload is input to the load current command calculation unit 32. The controller 23 controls the ON/OFF signal Vpls of the semiconductor switching element 26 of the booster circuit 21 so that the load voltage value Vload matches the load voltage command value Vref. Thereby, the viscosity of the electrorheological fluid 16 sealed in the vibration damping mechanism 12 is controlled to control the damping force to a desired value.

The semiconductor switching element drive circuit 27 drives the semiconductor switching element 26 according to the ON/OFF signal Vpls to the semiconductor switching element 26. When the semiconductor switching element 26 is turned on, energy is stored in the excitation inductance of the boosting transformer (transformer) 25 from the input-side smoothing capacitor 24. When the semiconductor switching element 26 is turned off, the energy stored in the excitation inductance of the boosting transformer (transformer) 25 is released to the second circuit, and the load voltage value Vload is applied to the electrorheological fluid 16 stored in the vibration damping mechanism 12 via the rectifier diode 28 by the energy. The electrorheological fluid 16 has the resistance component and an electrostatic capacitance component 18, which correspond to a connection load of the voltage control device 10. The voltage control device 10 and the vibration damping mechanism 12 are connected via the connection cable 11H and the connection cable 11L.

As described above, the inner cylinder 51 on the low potential side of a pair of electrode plates for applying an electric field to the electrorheological fluid 16 and the outer cylinder 43 of the vibration damping mechanism are electrically connected in terms of structure. However, since the outer cylinder 43 of the vibration damping mechanism is structurally insulated from the chassis ground 45 of the vehicle by an insulator 44 such as a rubber bush or a rubber mount, it is considered that the outer cylinder 43 of the vibration damping mechanism is grounded to the chassis ground 45 of the vehicle via the connection cable 11L and the ground line of the voltage control device 10 for protection against electric shock at the time of human contact.

However, if the insulator 44 such as a rubber bush or a rubber mount is exposed to muddy water, salt water, or the like, the insulation resistance between the outer cylinder 43 of the vibration damping mechanism and the chassis ground 45 of the vehicle decreases, and the leakage current returning to the voltage control device 10 via the chassis ground 45 of the vehicle without passing through the connection cable 11L increases in the current supplied from the voltage control device 10 to the vibration damping mechanism 12. Therefore, noises increase, which adversely affects surrounding electronic devices.

Here, the path of the leakage current that increases due to a decrease in insulation resistance of the insulator between the outer cylinder of the vibration damping mechanism and the chassis ground of the vehicle will be briefly described with reference to FIG. 6.

Figure 6:
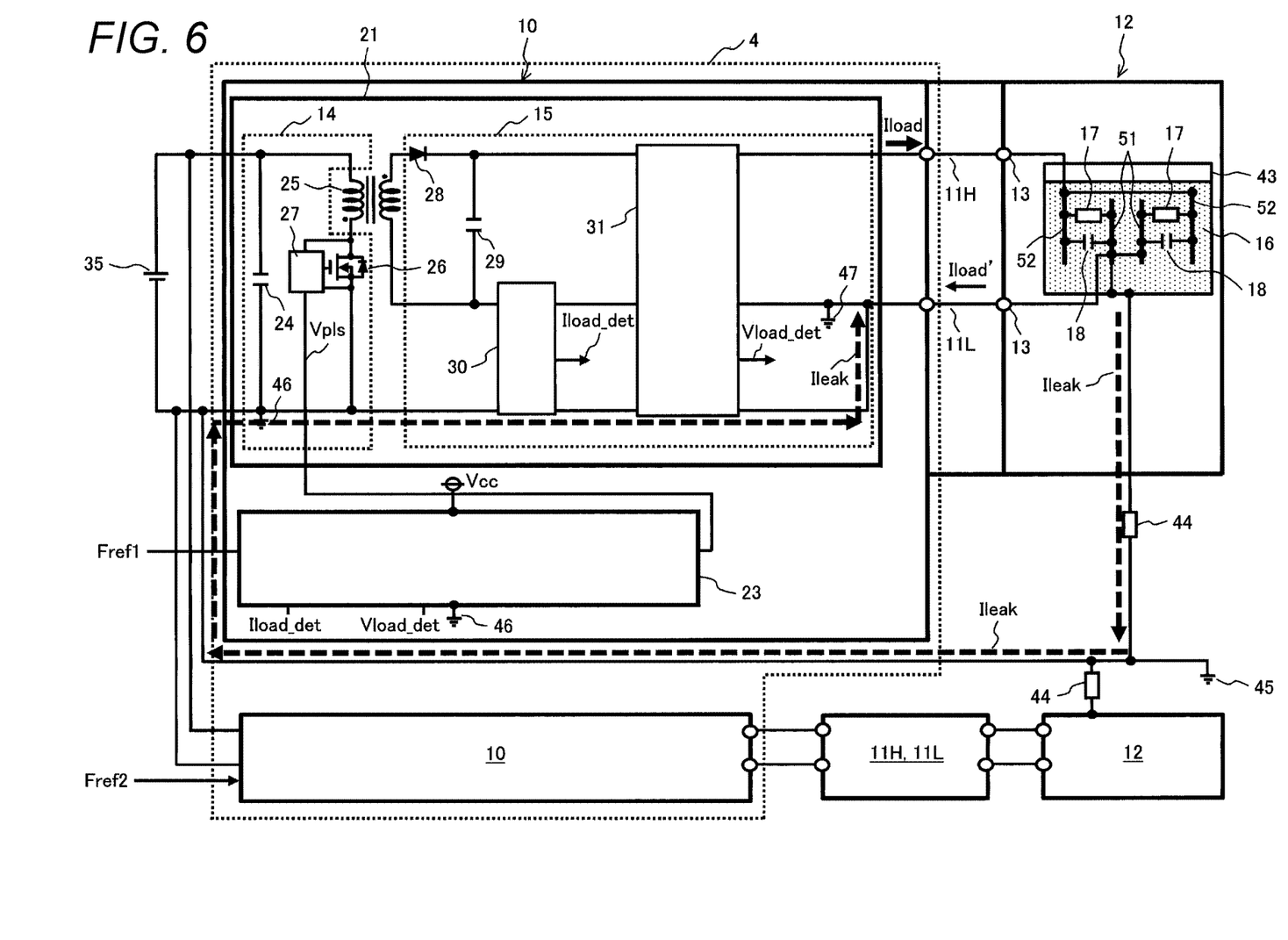
FIG. 6 is a diagram illustrating a problem of a conventional high-voltage system.

FIG. 6 illustrates a path of a leakage current Ileak of a current Iload supplied from the voltage control device 10 to the vibration damping mechanism 12 and returning to the voltage control device 10 via the chassis ground 45 of the vehicle without passing through the connection cable 11L (dotted arrow in FIG. 6). The load current Iload supplied from the voltage control device 10 to the vibration damping mechanism 12 flows to the electrorheological fluid 16 sealed in the vibration damping mechanism 12 via the connection cable 11H. After the flow of the electrorheological fluid 16, the load current Iload is divided into a return current Iload' returning to the voltage control device 10 via the connection cable 11L and the leakage current Ileak returning to the voltage control device 10 via the chassis ground 45 of the vehicle.

When the insulator 44 such as a rubber bush or a rubber mount is exposed to muddy water, salt water, or the like, the insulation resistance between the outer cylinder 43 of the vibration damping mechanism and the chassis ground 45 of the vehicle decreases, and the leakage current Ileak increases. It is relatively easy to take countermeasures against noise caused by the return current Iload' by twisting the connection cables 11L and 11H through which the return current Iload' flows and by adding a shield to the connection cables 11L and 11H. However, since the leakage current Ileak flows through the chassis ground 45 of a vehicle having a large area, it is difficult to take measures against noise. When the noise increases, there is a concern that the surrounding electronic devices may be adversely affected.

Figure 2:
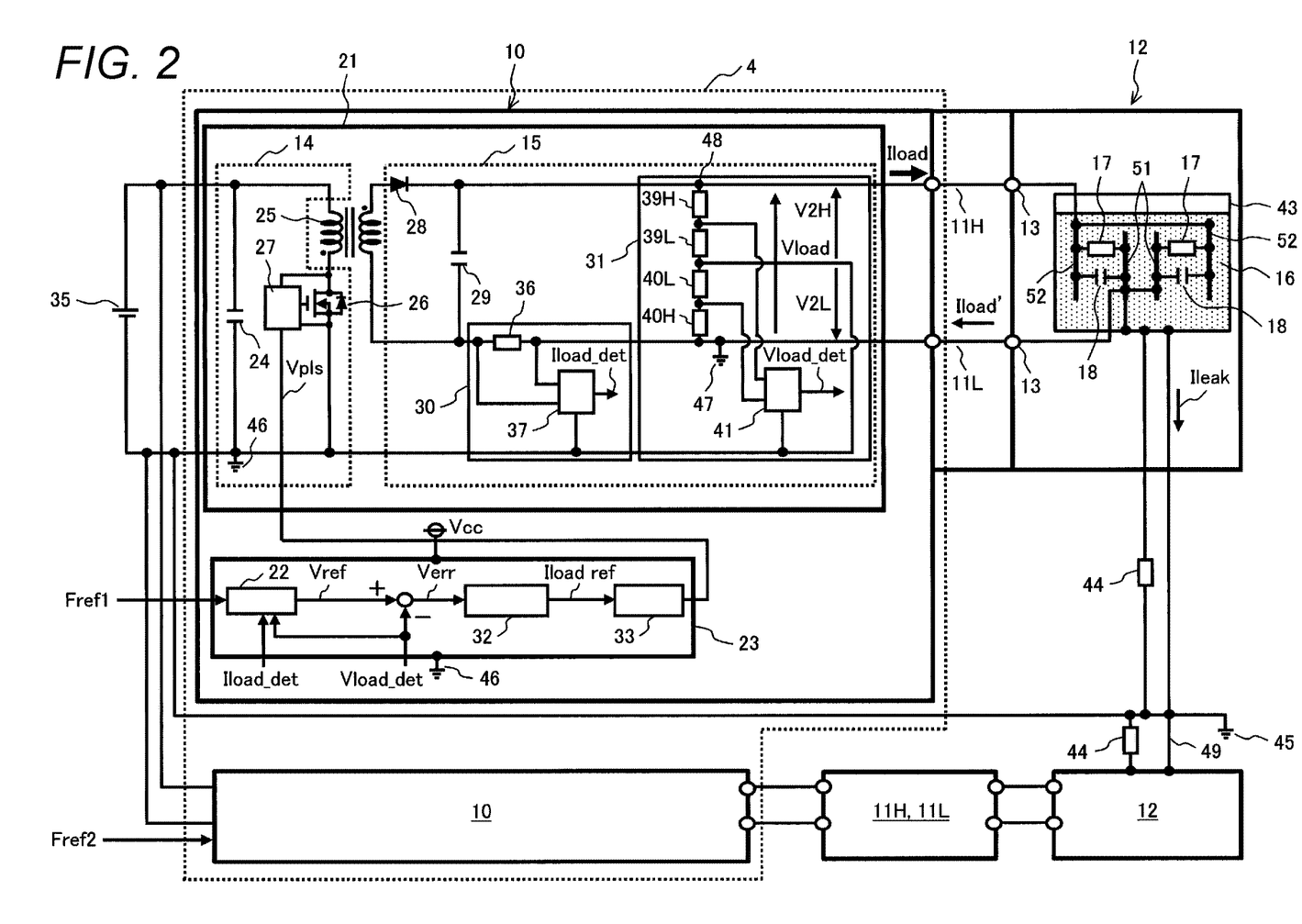
FIG. 2 is a diagram illustrating a configuration of a high-voltage system according to one embodiment of the invention. (First Embodiment)

Therefore, in the high-voltage system of this embodiment, as illustrated in FIG. 2, the outer cylinder 43 of the vibration damping mechanism is directly grounded to the chassis ground 45 of the vehicle using a grounding cable 49 in advance, so that the decrease in insulation resistance of the insulator 44 between the outer cylinder 43 of the vibration damping mechanism and the chassis ground 45 of the vehicle can be excluded, and the electric shock from the outer cylinder 43 of the vibration damping mechanism can be protected.

Further, a second resistor 40L and a second resistor 40H are provided between the ground 46 of the first circuit and the ground 47 of the second circuit of the voltage control device 10, and the impedance of the path returning to the voltage control device 10 via the chassis ground 45 of the vehicle from the vibration damping mechanism 12 is made sufficiently larger than the impedance of the path returning to the voltage control device 10 via the connection cable 11L from the vibration damping mechanism 12. Therefore, the leakage current returning to the voltage control device 10 via the chassis ground 45 of the vehicle from the vibration damping mechanism 12 can be reduced, and adverse effects on surrounding electronic devices due to an increase in noise can be prevented. (In FIG. 2, 40H and 40L are referred to as second resistors with respect to the first resistors 39H and 39L.) Further, the impedance of the path returning from the vibration damping mechanism 12 to the voltage control device 10 via the connection cable 11L is basically low because it is mainly caused by the wiring resistance and the wiring inductance of the connection cable 11L.

Further, in this embodiment, the load of the voltage control device 10 is the vibration damping mechanism 12, but if it is difficult to insulate the energizing portion of the load connected to the voltage control device 10 and the exposed conductive portion of the load, the same effects as in this embodiment can be obtained without using the vibration damping mechanism 12.

Further, as in this embodiment, by connecting the second circuit 15 of the voltage control device 10 and the vibration damping mechanism 12, which is a load, with the connection cables 11H and 11L, the degree of freedom of the installation position of each of the voltage control device 10 and the vibration damping mechanism 12 is improved. For example, four dampers (the vibration damping mechanisms 12) can be installed in a four-wheel vehicle, and four voltage control devices 10 can be housed in a common integrated housing and installed in the vehicle as an integrated voltage control device. Also, as compared with the case where the damper (the vibration damping mechanism 12) and the voltage control device 10 are integrally installed, there is an advantage that the vibration and heat of the damper (the vibration damping mechanism 12) are hardly transmitted to the voltage control device 10.

Second Embodiment

Next, a high-voltage system and a method for preventing an overvoltage failure of the high-voltage system according to a second embodiment will be described with reference to FIGS. 3 and 4.

This embodiment is different from the first embodiment in that a combined resistance value R40 of the second resistor 40L and the second resistor 40H is made smaller than a combined resistance value R39 of the first resistor 39L and the first resistor 39H provided in the booster circuit 21 in FIG. 2, and the other configuration is the same as the first embodiment. Here, differences between this embodiment and the first embodiment will be described.

In this embodiment, the combined resistance value R40 of the second resistor 40L and the second resistor 40H is made smaller than the combined resistance value R39 of the first resistor 39L and the first resistor 39H provided in the booster circuit 21 of FIG. 2. When the load current detection unit (third circuit) 30 is an inexpensive non-insulating type, the overcurrent failure of the current detection unit (third circuit) 30 is prevented when the connection cable 11L is disconnected.

As illustrated in the configuration of FIG. 2, the ground 46 of the first circuit of the voltage control device 10 is connected to the chassis ground 45 of the vehicle, and the ground 47 of the second circuit of the voltage control device 10 is also connected to the chassis ground 45 of the vehicle via the connection cable 11L, the outer cylinder 43 of the vibration damping mechanism, and the grounding cable 49. Therefore, the ground 46 of the first circuit and the ground 47 of the second circuit have the same potential.

Since the ground 46 of the first circuit and the ground 47 of the second circuit are at the same potential, the load current detection unit (third circuit) 30 can be an inexpensive non-insulating type, while the reference potential of the controller 23 inside the voltage control device 10 can be used as the ground 46 of the first circuit of the voltage control device 10.

However, in the configuration of FIG. 2, when the disconnection of the connection cable 11L occurs, the potential difference V2L occurs between the ground 46 of the first circuit and the ground 47 of the second circuit of the voltage control device 10, and when the load current detection unit (third circuit) 30 is of a non-insulated type, an overvoltage is applied to the load current detection unit (third circuit) 30, and the load current detection unit (third circuit) 30 is overvoltage-faulted.

Therefore, by reducing the combined resistance value R40 of the second resistor 40L and the second resistor 40H in comparison with the combined resistance value R39 of the first resistor 39L and the first resistor 39H, a voltage dividing ratio of the combined resistance value R40 to the value R39 is reduced, and the potential difference V2L between the ground 46 of the first circuit and the ground 47 of the second circuit when the connection cable 11L is disconnected can be suppressed within the breakdown voltage of the load current detection unit (third circuit) 30. The overvoltage failure of the load current detection unit (third circuit) 30 can be prevented.

In order to prevent the overvoltage failure of the load current detection unit (third circuit) 30 when the connection cable 11L is disconnected, the combined resistance value R40 needs to satisfy Inequality 1.

[Math. 1]

$$R_{40} \leq \frac{\frac{R_{load\_min} \cdot R_{39}}{R_{load\_min} + R_{39}} \cdot V_{CT\_max}}{V_{load\_max} - V_{CT\_max}} \quad \text{(Inequality 1)}$$

Here, R40 is a combined resistance value R40 [Ω] of the second resistor 40L and the second resistor 40H, Rload_min is a lower resistance value [Ω] of the resistance component 17 of the electrorheological fluid, R39 is a combined resistance value R39 [Ω] of the first resistor 39L and the first resistor 39H, VCT_max is the rated voltage [V] of the load current detection unit (third circuit) 30, and Vload max is the maximum value [V] of the load voltage.

The above-described combined resistance value R40 of the second resistor 40L and the second resistor 40H represents an upper limit of the resistance value for preventing an overvoltage failure of the load current detection unit (third circuit) 30 when the connection cable 11L is disconnected. In practice, a resistance value smaller than the upper limit and sufficiently larger than the impedance of the path returning from the vibration damping mechanism 12 to the voltage control device 10 through the chassis ground 45 of the vehicle only has to be selected.

Further, in this embodiment, the current detection unit has been illustrated as an example of the second circuit 15 to be protected from overvoltage failure and the third circuit 30 connected to the chassis ground 45 of the vehicle. As long as the circuit is connected to the second circuit 15 and the chassis ground 45 of the vehicle, the third circuit 30 may be a circuit having a function different from that of the current detection.

The effect of this embodiment will be described with reference to FIGS. 3 and 4. FIG. 3 illustrates temporal changes in the potential difference V2L between the ground 46 of the first circuit and the ground 47 of the second circuit when the connection cable 11L is disconnected (not applied with the invention) and the potential difference V2H between the ground 46 of the first circuit and the connection point 48 of a high potential end of the second circuit.

Figure 3:
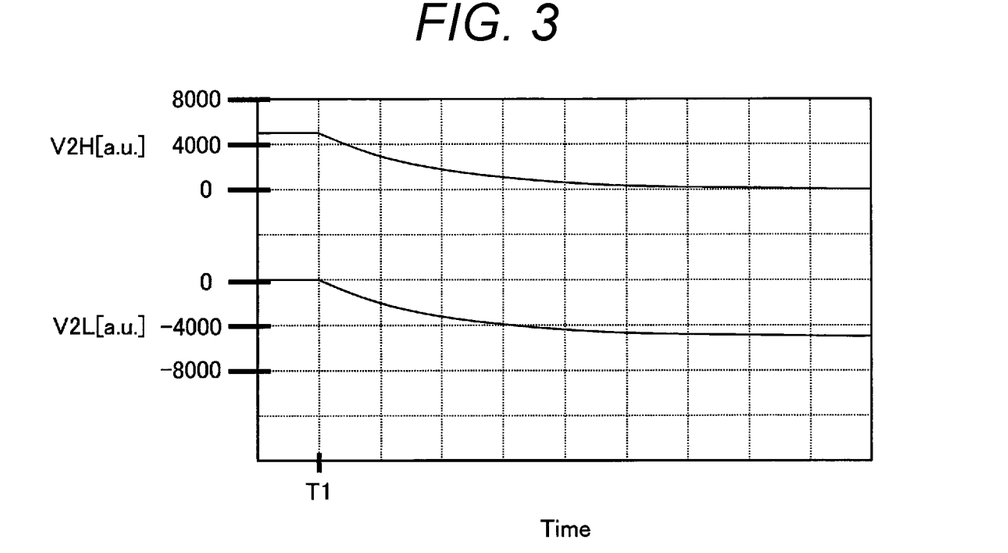
FIG. 3 is a diagram illustrating temporal changes in a potential difference V2L between a ground 46 of a first circuit and a ground 47 of a second circuit when a connection cable 11L is disconnected (not applied with the invention) and a potential difference V2H between the ground 46 of the first circuit and a connection point 48 of a high potential end of the second circuit.

In FIG. 3, the combined resistance value R39 of the first resistor 39L and the first resistor 39H is the same as the combined resistance value R40 of the second resistor 40L and the second resistor 40H. At time T1 in FIG. 3, the connection cable 11L is disconnected, and it can be seen that the potential difference V2L between the ground 46 of the first circuit and the ground 47 of the second circuit increases from 0 [a.u.] to about −5000 [a.u.].

Here, [a.u.] represents a relative value. Since the potential difference of V2L is applied to the load current detection unit (third circuit) 30, for example, when the rated voltage of the load current detection unit (third circuit) 30 is about 10 [a.u.], an overvoltage greatly exceeding the rated voltage is applied to the load current detection unit (third circuit) 30, causing an overvoltage failure of the load current detection unit (third circuit) 30.

Figure 4:
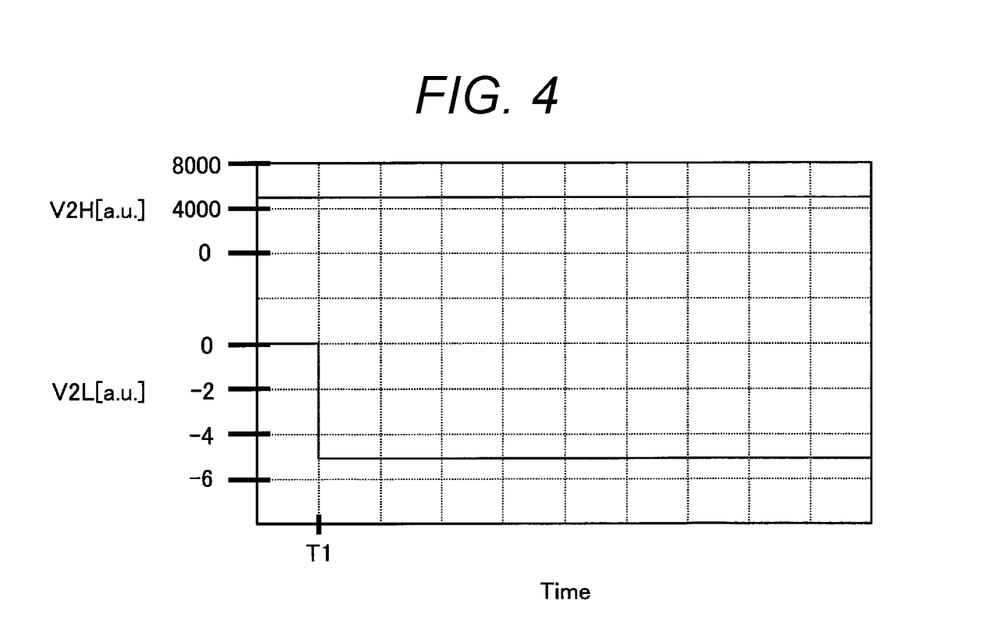
FIG. 4 is a diagram illustrating temporal changes in the potential difference V2L between the ground 46 of the first circuit and the ground 47 of the second circuit when the connection cable 11L is disconnected (applied with the invention) and the potential difference V2H between the ground 46 of the first circuit and the connection point 48 of the high potential end of the second circuit.

FIG. 4 illustrates temporal changes in the potential difference V2L between the ground 46 of the first circuit and the ground 47 of the second circuit when the connection cable 11L is disconnected (applied with the invention) and the potential difference V2H between the ground 46 of the first circuit and the connection point 48 of a high potential end of the second circuit. In FIG. 4, the combined resistance value R40 of the second resistor 40L and the second resistor 40H is a value (low value) different from the combined resistance value R39 of the first resistor 39L and the first resistor 39H.

At time T1 in FIG. 4, the connection cable 11L is disconnected, but the potential difference V2H between the ground 46 of the first circuit and the connection point 48 at the high potential end of the second circuit is about 4995 [a.u.], and almost all voltage is shared between the ground 46 of the first circuit and the connection point 48 at the high potential end of the second circuit. It can be seen that the potential difference V2L between the ground 46 of the first circuit and the ground 47 of the second circuit is increased from 0 [a.u.] to about −5 [a.u.].

As described above, by applying the invention, the combined resistance value R40 of the second resistor 40L and the second resistor 40H is determined such that the potential difference V2L between the ground 46 of the first circuit and the ground 47 of the second circuit when the connection cable 11L is disconnected is set to be equal to or less than the rated voltage of the load current detection unit (third circuit) 30, so that it is possible to prevent an overvoltage failure of the load current detection unit (third circuit) 30 when the connection cable 11L is disconnected.

Third Embodiment

Figure 5:
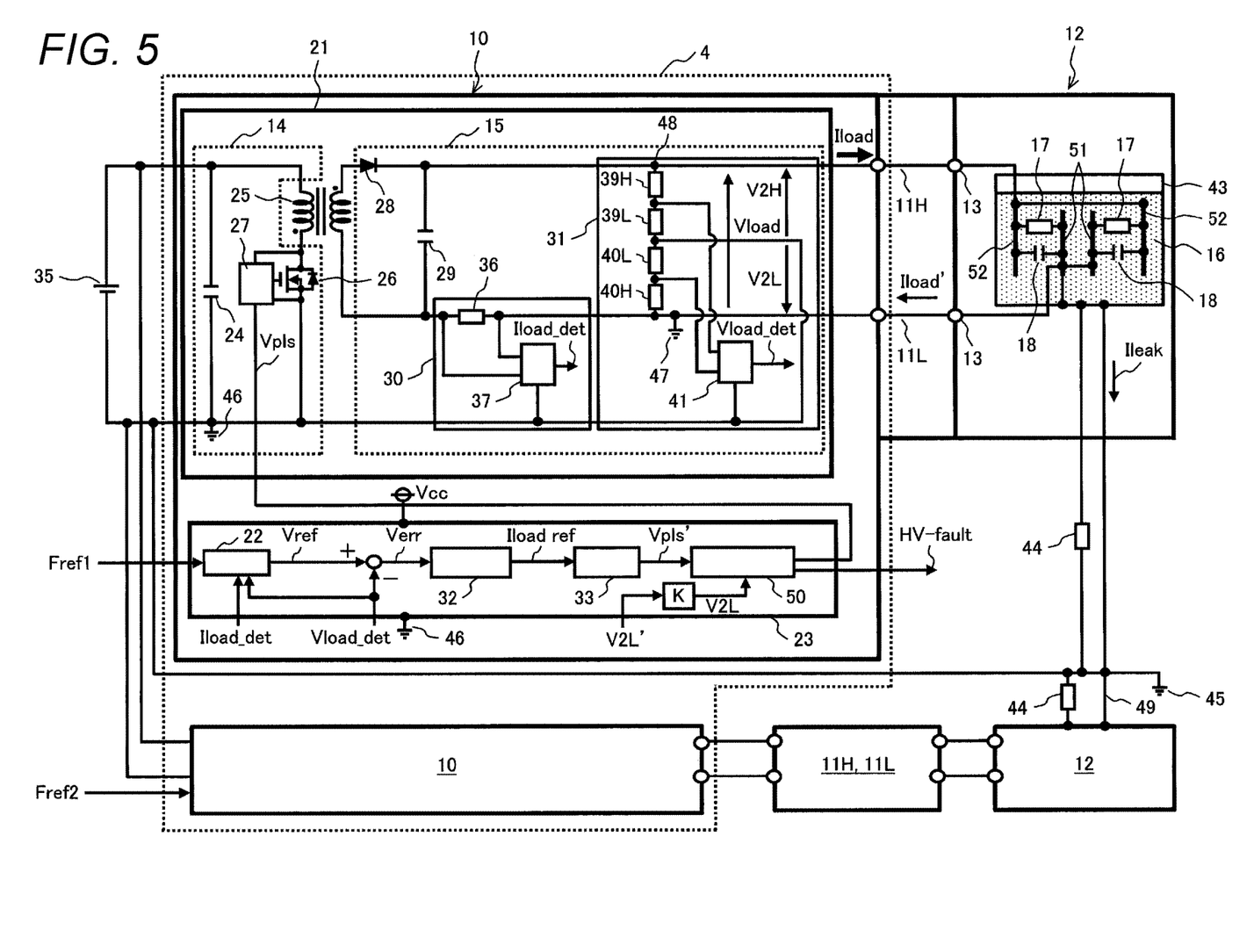
FIG. 5 is a diagram illustrating a configuration of a high-voltage system according to an embodiment of the invention. (Third Embodiment)

Next, a high-voltage system and a failure diagnosis method for the high-voltage system according to a third embodiment will be described with reference to FIG. 5. Here, differences between this embodiment and the second embodiment will be described.

In this embodiment, when the potential difference V2L between the ground 46 of the first circuit and the ground 47 of the second circuit exceeds a threshold voltage Vfault, the disconnection of the connection cable 11L is detected, and the output of the voltage control device 10 is stopped, or an alarm is output. The potential difference V2L between the ground 46 of the first circuit and the ground 47 of the second circuit is calculated by multiplying a voltage dividing ratio K of the resistor 40L and the resistor 40H to the voltage V2L' at the middle point between the resistors 40L and 40H in the load voltage detection unit 31.

The voltage V2L' at the middle point between the resistor 40L and the resistor 40H in the voltage control device detection unit 31 is sent to the controller 23, and is multiplied by the voltage dividing ratio K to be converted into the potential difference V2L between the ground 46 of the first circuit and the ground 47 of the second circuit, and input to a connection cable 11L disconnection protector (detector) 50. In the connection cable 11L disconnection protector (detector) 50, the threshold voltage Vfault is compared with the potential difference V2L between the ground of the first circuit and the ground 47 of the second circuit. If V2L is larger, the ON/OFF signal Vpls to the semiconductor switching element 26 is stopped to stop the output of the voltage control device 10 or to output a connection cable 11L disconnection alarm HV-fault to the high-level control device (not illustrated).

The threshold voltage Vfault to be compared with the potential difference V2L between the ground 46 of the first circuit and the ground 47 of the second circuit in order to detect the disconnection of the connection cable 11L needs to satisfy Inequality 2.

[Math. 2]

$$V_{fault} \leq \frac{R_{40}}{\frac{R_{load\_max} \cdot R_{39}}{R_{load\_max} + R_{39}} \cdot R_{40}} \cdot V_{out\_min} \quad \text{(Inequality 2)}$$

Here, Vfault is a threshold voltage [V] which is compared with a potential difference V2L between the ground 46 of the first circuit and the ground 47 of the second circuit to detect a disconnection of the connection cable 11L, R40 is a combined resistance value R40 [Ω] of the resistor 40L and the resistor 40H, Rload_max is the upper limit resistance [Ω] of the resistance component 17 of the electrorheological fluid, R39 is the combined resistance value R39 [Ω] of the resistors 39L and 39H, and Vout_min is the minimum regulation [V] of the voltage control device 10.

Further, the above-described threshold voltage Vfault indicates an upper limit value of the threshold voltage for detecting disconnection of the connection cable 11L. However, in practice, a voltage value equal to or lower than the upper limit value and within a range in which detection accuracy can be sufficiently ensured only has to be selected.

Further, the invention is not limited to the embodiments described above, but includes various modifications.

For example, the above embodiments have been described in detail for easy understanding of the invention, and the invention is not necessarily limited to having all the configurations described. A part of the configuration of a certain embodiment can be replaced with the configuration of another embodiment, and the configuration of another embodiment can be added to the configuration of a certain embodiment. It is possible to add, delete, and replace other configurations for a part of the configuration of each embodiment.

REFERENCE SIGNS LIST

4 integrated housing
5 lateral hole
6 piston rod
9 piston
9U piston upper chamber
9L piston lower chamber
9h through hole
10 voltage control device
11H, 11L connection cable
12 vibration damping mechanism
13 electrical connection
14 first circuit
15 second circuit
16 electrorheological fluid
17 resistance component of electrorheological fluid
18 electrostatic capacitance component of electrorheological fluid
21 boosting circuit
22 load voltage command calculation unit
23 controller
24 input-side smoothing capacitor
25 boosting transformer (transformer) (transformer)
26 semiconductor switching element
27 semiconductor switching element drive circuit
28 rectifier diode
29 output-side smoothing capacitor
30 load current detection unit (third circuit)
31 load voltage detection unit
32 load current command calculation unit
33 PWM pulse generation unit
35 (DC) power source
36 load current detection resistor
37 differential amplifier (for load current detection)
39H, 39L first resistor
40H, 40L second resistor
41 differential amplifier (for load voltage detection)
43 outer cylinder
43a upper end plate
44 insulator
45 chassis ground of vehicle
46 ground of first circuit
47 ground of second circuit
48 connection point at the high potential end of second circuit
49 ground cable
50 connection cable 11L disconnection protector (detector)
51 inner cylinder
52 intermediate cylinder
54 base valve
54h through hole
55 flow path
56 flow path
57 flow path
58 inert gas
59 oil seal
60 rod guide
61 insulating spacer

The invention claimed is:

1. A high-voltage system, comprising:
a first circuit that includes a power source and a ground;
a second circuit that is magnetically coupled to the first circuit via a transformer and includes a load connected to the ground;
a controller that is connected to the ground;
a third circuit that is connected to the second circuit and the ground;
a first resistor that is provided between a connection point at a high potential end of the second circuit and the ground; and
a second resistor that is provided between a connection point at a low potential end of the second circuit and the ground, and has a resistance value different from a resistance value of the first resistor;

wherein a resistance value (R40) of the second resistor is calculated by Inequality 1:

$$R_{40} \leq \frac{\frac{R_{load\_min} \cdot R_{39}}{R_{load\_min} + R_{39}} \cdot V_{CT\_max}}{V_{load\_max} - V_{CT\_max}}.$$

2. The high-voltage system according to claim 1, wherein the load is a vibration damping mechanism.

3. The high-voltage system according to claim 2, wherein a working fluid of the vibration damping mechanism is an electrorheological fluid.

4. The high-voltage system according to claim 3, wherein the vibration damping mechanism includes
 an inner cylinder into which a rod is inserted,
 an outer cylinder that is provided outside the inner cylinder,
 an intermediate cylinder that is an electrode provided between the inner cylinder and the outer cylinder, formed with a passage, between the inner cylinder and the outer cylinder, through which the electrorheological fluid flows from one end side to the other end side of the vibration damping mechanism in an axial direction as the rod reciprocates,
 a rod guide that is provided to close an end portion of the one end side of the inner cylinder and the outer cylinder, and supports the rod,
 a base valve that is provided in an end portion of the other end side of the inner cylinder and the outer cylinder, and
 a seal member that seals the rod guide and an end portion of one end side of the intermediate cylinder, and
the inner cylinder, the outer cylinder, the base valve, and the rod guide are fixed to each other while maintaining a residual axial force.

5. The high-voltage system according to claim 2, wherein the vibration damping mechanism is attached to at least two wheels of a vehicle.

6. The high-voltage system according to claim 1, wherein the second circuit and the load are connected by a cable.

7. The high-voltage system according to claim 6, wherein the first circuit, the transformer, the second circuit, the controller, the third circuit, the first resistor, the second resistor, the cable, and at least one additional load are included, and the first circuit, the transformer, the second circuit, the controller, the third circuit, the first resistor, and the second resistor, are stored in one housing.

8. The high-voltage system according to claim 1, wherein the third circuit is a current detection unit for detecting a current of the load.

9. The high-voltage system according to claim 1, wherein a resistance value of the second resistor is lower than a resistance value of the first resistor.

10. A high-voltage system, comprising:
 a first circuit that includes a power source and a ground;
 a second circuit that is magnetically coupled to the first circuit via a transformer and includes a load connected to the ground;
 a controller that is connected to the ground;
 a third circuit that is connected to the second circuit and the ground;
 a first resistor that is provided between a connection point at a high potential end of the second circuit and the ground; and
 a second resistor that is provided between a connection point at a low potential end of the second circuit and the ground, and has a resistance value different from a resistance value of the first resistor;
 wherein, when a voltage across the second resistor is equal to or higher than a predetermined threshold voltage, an operation of the first circuit is stopped or an alarm is output.

11. The high-voltage system according to claim 10, wherein the threshold voltage (Vfault) is calculated by the following expression:

$$V_{fault} \leq \frac{R_{40}}{\frac{R_{load\_max} \cdot R_{39}}{R_{load\_max} + R_{39}} \cdot R_{40}} \cdot V_{out\_min}.$$

12. A failure diagnosis method for a high-voltage system which includes:
 a first circuit that includes a power source and a ground;
 a second circuit that is magnetically coupled to the first circuit via a transformer and includes a load connected to the ground;
 a controller that is connected to the ground;
 a third circuit that is connected to the second circuit and the ground;
 a first resistor that is provided between a connection point at a high potential end of the second circuit and the ground; and
 a second resistor that is provided between a connection point at a low potential end of the second circuit and the ground, and has a resistance value different from a resistance value of the first resistor,
 wherein, when a voltage across the second resistor is equal to or higher than a predetermined threshold voltage, it is determined that the high-voltage system has failed.

13. The failure diagnosis method for the high-voltage system according to claim 12, wherein the threshold voltage (Vfault) is calculated by the following expression:

$$V_{fault} \leq \frac{R_{40}}{\frac{R_{load\_max} \cdot R_{39}}{R_{load\_max} + R_{39}} + R_{40}} \cdot V_{out\_min}.$$

* * * * *